(12) United States Patent
Jung

(10) Patent No.: US 7,435,932 B2
(45) Date of Patent: Oct. 14, 2008

(54) CONTROL UNIT OF OVEN

(75) Inventor: Eui Su Jung, Changwon-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/580,017

(22) Filed: Oct. 13, 2006

(65) Prior Publication Data

US 2007/0093091 A1    Apr. 26, 2007

(30) Foreign Application Priority Data

Oct. 25, 2005  (KR)  ............... 10-2005-0100545
Oct. 25, 2005  (KR)  ............... 10-2005-0100546

(51) Int. Cl.
*H05B 6/66* (2006.01)
(52) U.S. Cl. .................................... 219/702
(58) Field of Classification Search ............ 439/76.1; 361/736, 752; 219/702, 720
See application file for complete search history.

(56) References Cited

U.S. PATENT DOCUMENTS

| | | | | |
|---|---|---|---|---|
| 4,092,698 A | * | 5/1978 | Brefka | 361/752 |
| 4,336,569 A | * | 6/1982 | Tsuda et al. | 361/736 |
| 4,975,676 A | * | 12/1990 | Greenhalgh | 338/114 |
| 5,726,424 A | * | 3/1998 | Koether | 219/414 |
| 6,507,377 B1 | * | 1/2003 | Jung | 349/60 |
| 6,881,935 B2 | * | 4/2005 | Kim et al. | 219/702 |
| 6,984,811 B2 | * | 1/2006 | Lee | 219/702 |
| 7,026,589 B2 | * | 4/2006 | Kim | 219/702 |

* cited by examiner

*Primary Examiner*—Neil Abrams
(74) *Attorney, Agent, or Firm*—Birch, Stewart, Kolasch & Birch, LLP (57) ABSTRACT

Provided is a control unit of an oven. The control unit includes a board support panel, a first PCB, and a second PCB. The first PCB is installed on a backside of the board support panel such that heat from a heat source of the oven is blocked by the board support panel so as to reduce the heat on the first PCB. The second PCB is installed on a front side of the board support panel and may be a display PCB. The board support panel may be formed with resilient hooks to retain the PCBs.

17 Claims, 8 Drawing Sheets

Figure 8

CONTROL UNIT OF OVEN

BACKGROUND OF THE INVENTION

1. Field of the Invention

The present invention relates to an oven.

2. Description of the Related Art

Generally, an oven is a cooking apparatus designed for sealing and heating cooking materials including food to ripen the food. Since the oven can roast up and down portions of the cooking materials to a desired degree without turning over the cooking materials, the oven is convenient to use. The oven can be classified into an electric oven, a gas oven, an electronic oven, and a composite oven depending on a heat source used.

A control unit for controlling each part of the oven is provided to the oven. The control unit includes a printed circuit board (PCB) on which various circuits are formed, and a board support panel on which the PCB is installed.

In a related art, the PCB is integrally formed. The PCB is mounted on one side of the board support panel. Therefore, a kind of the PCB that can be formed on the board support panel can be limited due to a limited space of the board support panel.

Also, the board support panel is exposed to a front side of the oven according to a related art. The PCB is installed on a backside of the board support panel. A cook top is installed on a front side of the board support panel. Therefore, hot air delivered from the cook top during a cooking operation has an influence on the PCB, so that a disorder of the PCB may be generated.

SUMMARY OF THE INVENTION

Accordingly, the present invention is directed to a control unit of an oven that substantially obviates one or more problems due to limitations and disadvantages of the related art.

An object of the present invention is to provide a control unit of an oven, capable of increasing utility of a limited space of a board support panel.

Another object of the present invention is to provide a control unit of an oven, capable of preventing a disorder of a PCB by blocking off hot air delivered from a cook top, etc.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a control unit of an oven, the control unit including: a board support panel; a first PCB installed on a backside of the board support panel; and a second PCB installed on a front side of the board support panel.

In another aspect of the present invention, there is provided a control unit of an oven, the control unit including: a front panel; a board support panel installed on a backside of the front panel; and a PCB installed on a backside of the board support panel.

In a further another aspect of the present invention, there is provided a control unit of an oven, the control unit including: a front panel; a board support panel installed on a backside of the front panel; a main PCB installed on a backside of the board support panel; and a display PCB installed on a front side of the board support panel.

According to a control unit of an oven of the present invention, a portion of a PCB that requires a heatsink operation is disposed on a backside of a board support panel, and a front panel is disposed on a front side of the board support panel. Therefore, heat of the PCB can be radiated through a double structure of the board support panel and the front panel. Therefore, heatsink for the PCB can be reliably performed.

Also, according to the control unit, a main PCB and a display PCB are separated from each other, and installed on one board support panel. Therefore, since various PCB can be installed on the board support panel, a control unit having various functions can be manufactured in a compact form.

Also, according to the control unit, a display PCB having relatively excellent heat-resistant characteristic is disposed on a front side of a board support panel, so that a space corresponding to the space where the display PCB has been installed is secured as an extra space on a backside of the board support panel. Therefore, a main PCB can be extended in the secured space on the backside of the board support panel. Accordingly, circuits having various control functions can be additionally installed on the main PCB, which increases extensibility of the control unit and increases space utility.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. However, the present invention should not be construed as being limited to the embodiments described herein, and other embodiments can be readily proposed within the scope of the present invention by addition, modifications, deletion of other elements and known arts.

Figure 1:
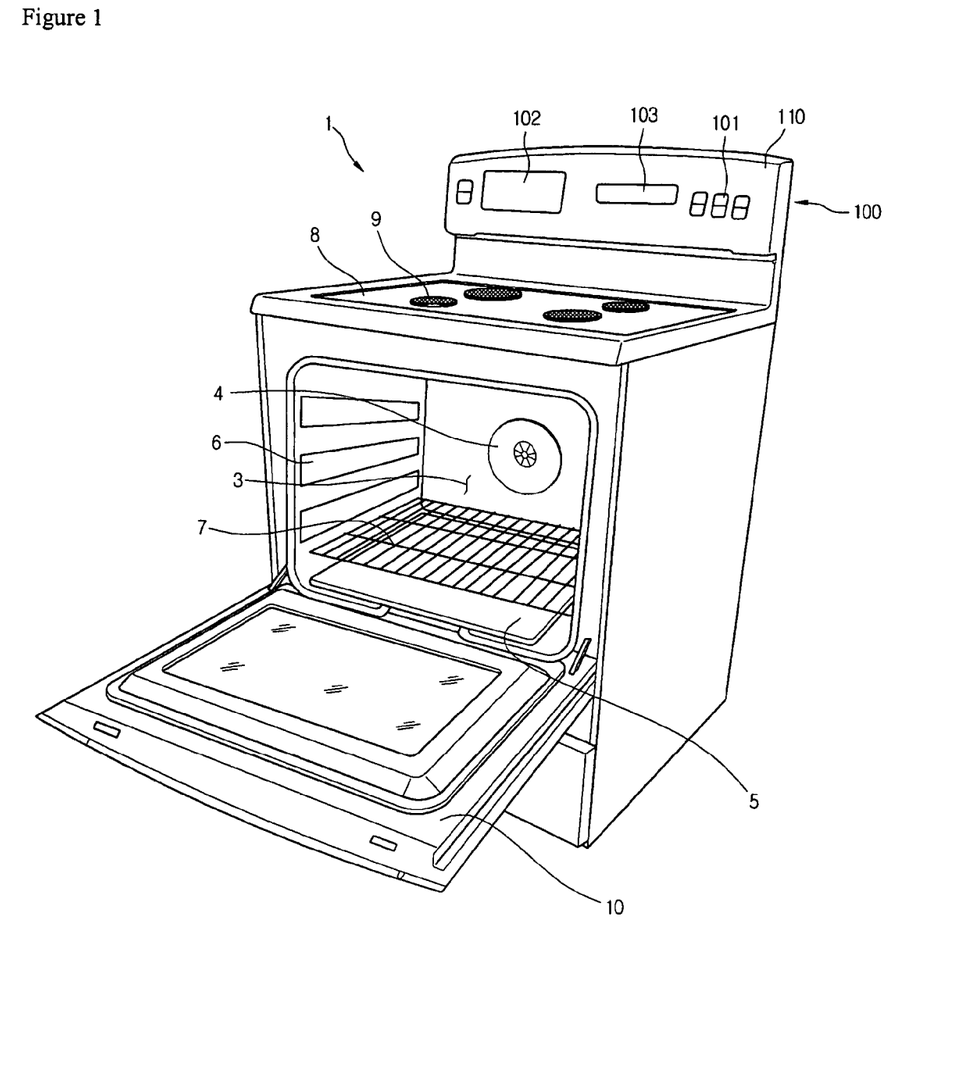
FIG. 1 is a perspective view illustrating an oven to which a control unit according to an embodiment of the present invention is adopted.

FIG. 1 is a perspective view illustrating an oven to which a control unit according to an embodiment of the present invention is adopted.

Referring to FIG. 1, the oven 1 includes a door 10 mounted on a front portion of the oven to rotate, and a cavity 3 opened/closed by the door 10. The cavity 3 is a space in which food is cooked. Also, the oven 1 further includes a convection heater disposed on a backside of the cavity 3 and acting on the cavity 3, and a fan 4.

Also, one or more rack guides 6 are provided on both sides of the cavity 3, and one or more racks 7 can be fitted in the rack guides 6. In detail, the rack 7 is a portion on which a container containing food is put, and can be moved in a back-and-forth direction in an inside of the cavity 3, guided by the rack guide 6.

Also, a bake heater (not shown) serving as a heat source during a cooking operation, and a double bottom 5 coupled to an upper surface of the bake heater are provided to a lower portion of the cavity 3. The double bottom 5 allows the bake heater not to be exposed to the outside during a cooking operation. Therefore, a danger that the bake heater is exposed to damage a user can be prevented.

Meanwhile, the oven includes a cook top 8 formed on an upper portion of the oven, and at least one cook top heater 9 formed on the cook top 8. A control unit 100 is provided to the cook top 8. The control unit 100 controls each part of the oven 1.

The control unit 100 includes a front panel 110 constituting a front side of the control unit 100. The front panel 110 constitutes a front appearance of the control unit 100 and protects other parts of the control unit 100 arranged on a backside of the front panel 110 from external impulse. Various manipulation buttons 101, display windows 102 and 103 are formed on an outer surface of the front panel 110. The manipulation button 101 allows a user to input his requirements, and the display windows 102 and 103 allows predetermined data displayed from a backside of the front panel 110 to be known to an outside of the front panel 110. Therefore, the display windows 102 and 103 can be formed of a transparent material having predetermined strength. Data such as an operation state and a remaining operating time can be displayed through the display windows 102 and 103.

Figure 2:
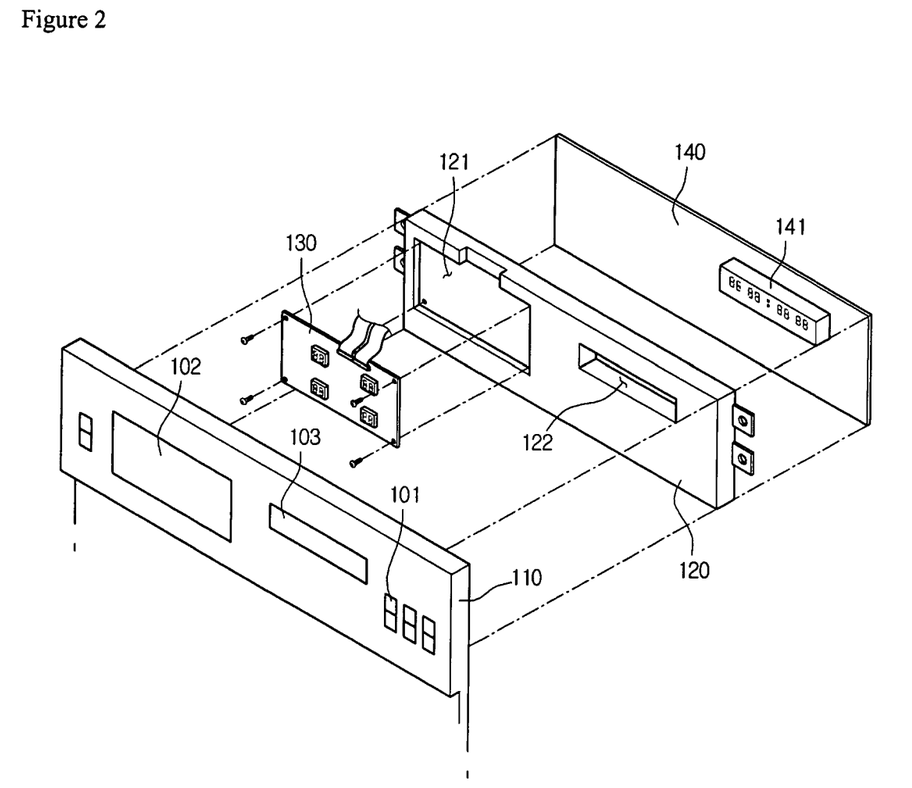
FIG. 2 is an exploded perspective view of a control unit according to the present invention.

FIG. 2 is an exploded perspective view of a control unit according to the present invention.

Referring to FIG. 2, the control unit 100 includes a front panel 110, a display printed circuit board (PCB) 130 displayed on a backside of the front panel 110, a board support panel 120, and a main PCB 140.

The display PCB 130 is intended for displaying predetermined data. The data includes an operating state of the cook top 8 and a remaining operating time. The data displayed by the display PCB 130 can be viewed to an outside through the display window 102 formed on the front panel 110. The display PCB 130 is installed on a front side of the board support panel 120.

The board support panel 120 supports the display PCB 130 and the main PCB 140. In detail, the board support panel 120 includes a front seat groove 121 having a predetermined depth and formed on one side of the front side of the board support panel 120. A depth and a shape of the front seat groove 121 can be formed to correspond to a thickness and a shape of the display PCB 130. With this construction, the display PCB 130 is seated in the front seat groove 121 and supported by the board support panel 120. A predetermined groove is formed in a backside of the board support panel 120 to receive the main PCB 140, which will be described with reference to FIG. 4.

Also, a display hole 122 is formed in one side of the board support panel 130. The display hole 122 receives a second display part 141 formed on the main PCB 140. With this construction, data displayed by the second display part 141 can be viewed to an outside through the display window 103 of the front panel 110.

The main PCB 140 performs a control function for each part of the oven 1. The main PCB 140 includes various devices in order to perform the control function. For normal operations, the devices included in the main PCB 140 need to irradiate heat generated therefrom to the outside. In the present embodiment, the main PCB 140 is disposed on a backside of the board support panel 120. Also, the front panel 110 is disposed on the front side of the board support panel 120. With the above-described construction, hot air generated from the cook top 8 is blocked by the board support panel 120 and the front panel 110, so that delivery of hot air to the main PCB 140 can be reduced or blocked. Therefore, heat transfer to the main PCB 140 is prevented, so that the main PCB 140 may not be influenced by the heat transfer.

Meanwhile, according to the present invention, the PCB adopted to the control unit 100 can be divided into the main PCB 140 and the display PCB 130. Also, the board support panel 120 has a space in which the main PCB 140 and the display PCB 130 can be seated. With this construction, a plurality of various PCBs can be independently installed on one board support panel 120.

Figure 3:
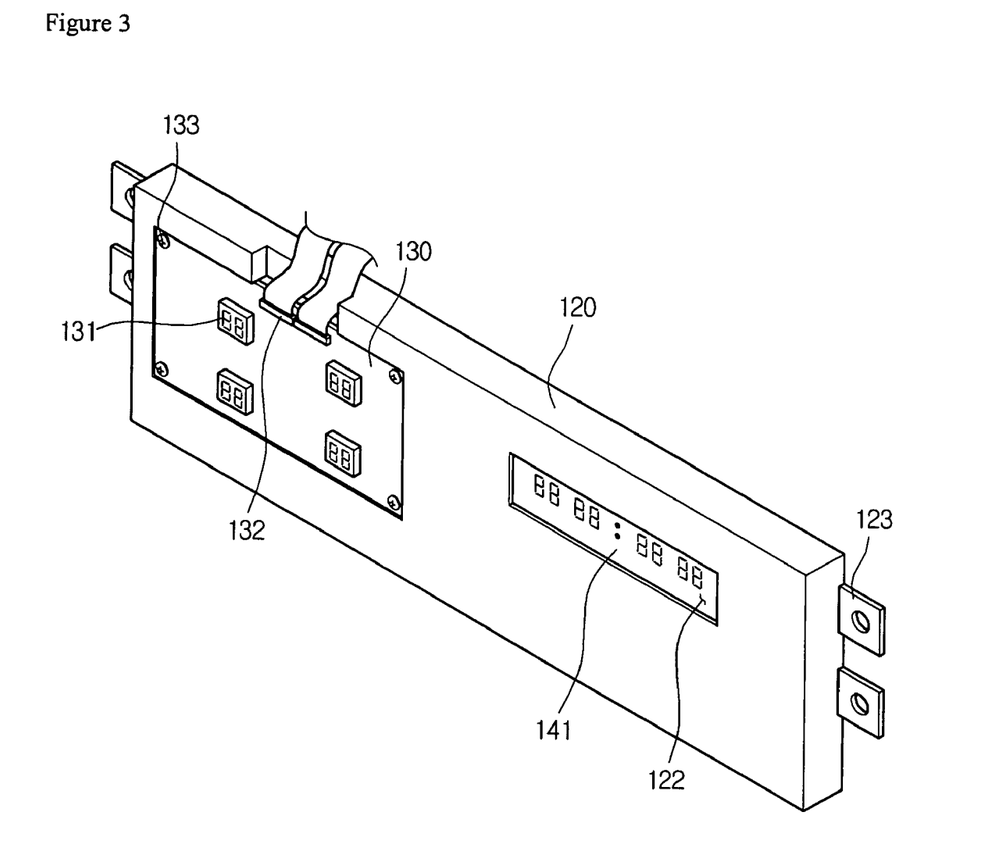
FIG. 3 is a front perspective view illustrating a board support panel on which a PCB adopted to a control unit according to an embodiment of the present invention is installed.

FIG. 3 is a front perspective view illustrating a board support panel on which a PCB adopted to a control unit according to an embodiment of the present invention is installed.

Referring to FIG. 3, a front seat groove 121 is formed in a front side of the board support panel 120 to receive the display PCB 130. The display PCB 130 can be coupled to the board support panel 120 using a coupling member 133 such as a bolt. For stable coupling of the display PCB 130 to the board support panel 120, the coupling member 133 can be coupled to each corner of the display PCB 130.

The display PCB 130 is seated in the front seat groove 121 as described above and installed in the board support panel 120. A display part 131 for displaying various data, and a connector 132 can be installed on the display PCB 130. The data displayed by the display part 131 can be viewed to the outside through the display window 102 of the front panel 110.

The display hole 122 is formed in one side of the display PCB 130 installed in the board support panel 120. Data displayed by a second display part 141 disposed on a backside of the board support panel 120 is exposed to the front side through the display hole 122. The exposed data can be viewed to the outside through the display window 103 of the front panel 110.

Meanwhile, a coupling protrusion 123 is formed on an outer periphery of the board support panel 120. The coupling protrusion 123 has a hole through which a separate fixing member can pass. The fixing member that has passed through the coupling protrusion 123 couples to a corresponding portion of the front panel 110, so that the board support panel 120 can be installed on the front panel 110. Here, for stable coupling of the board support panel 120, a plurality of coupling protrusions 123 can be formed along the outer periphery of the board support panel 120.

The display PCB 130 and the main PCB 140 are separately partitioned and installed in the board support panel 120. In detail, the display PCB 130 is installed on a front side of the board support panel 120, and the main PCB 140 is installed on the backside of the board support panel 120. The display PCB 130 can operate even in a higher temperature environment compared to the main PCB 140. Therefore, when the display PCB 130 having relatively excellent heat-resistant characteristic is disposed on a front side of the board support panel 120, a space corresponding to the space where the display PCB 130 has been installed is secured as an extra space on a backside of the board support panel. Therefore, a main PCB 140 can be extended in the secured space on the backside of the board support panel. Accordingly, circuits having various control functions can be additionally installed on the main PCB 140, which increases extensibility of the control unit and increases space utility.

Figure 4:
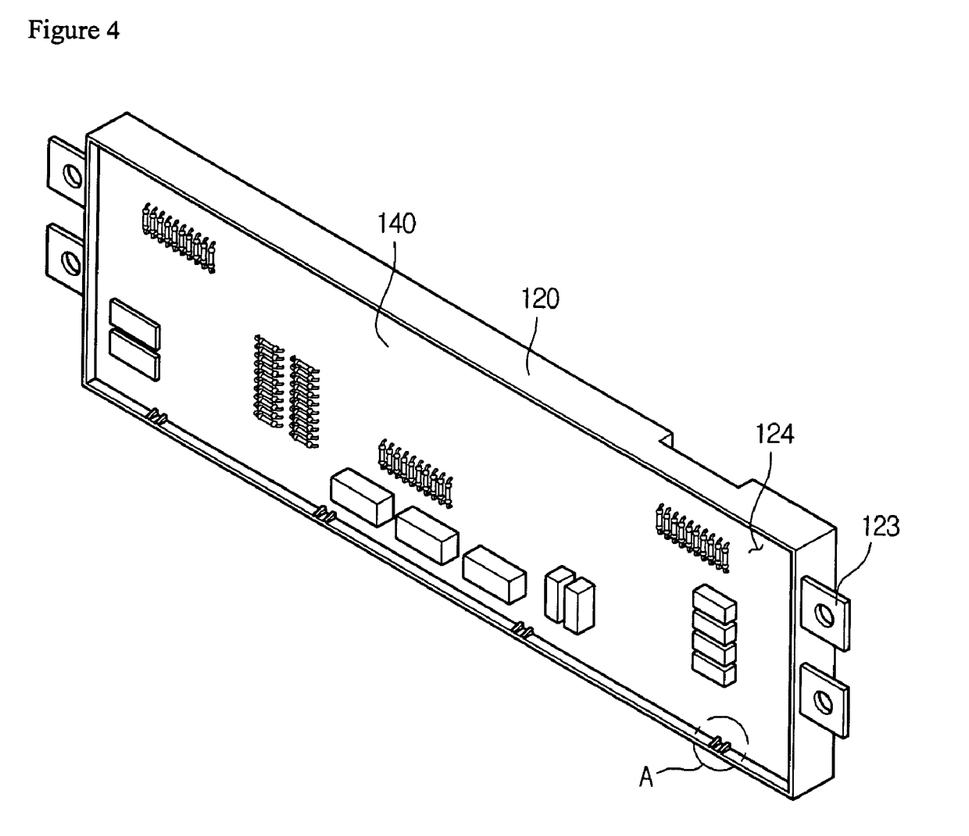
FIG. 4 is a perspective view illustrating a backside of a board support panel on which a PCB adopted to a control unit according to an embodiment of the present invention is installed.

FIG. 4 is a perspective view illustrating a backside of a board support panel on which a PCB adopted to a control unit according to an embodiment of the present invention is installed.

Referring to FIG. 4, a backside seat groove 124 is formed to a predetermined depth in a backside of the board support panel 120. A depth and a shape of the backside seat groove 124 can be formed to correspond to a thickness and a shape of the main PCB 140. With this construction, the main PCB 140 is seated in the backside seat groove 124 and supported by the board support panel 120.

The main PCB 140 is coupled to the board support panel 120 using a hook, which will be described with reference to FIGS. 5 and 6.

Figure 5:
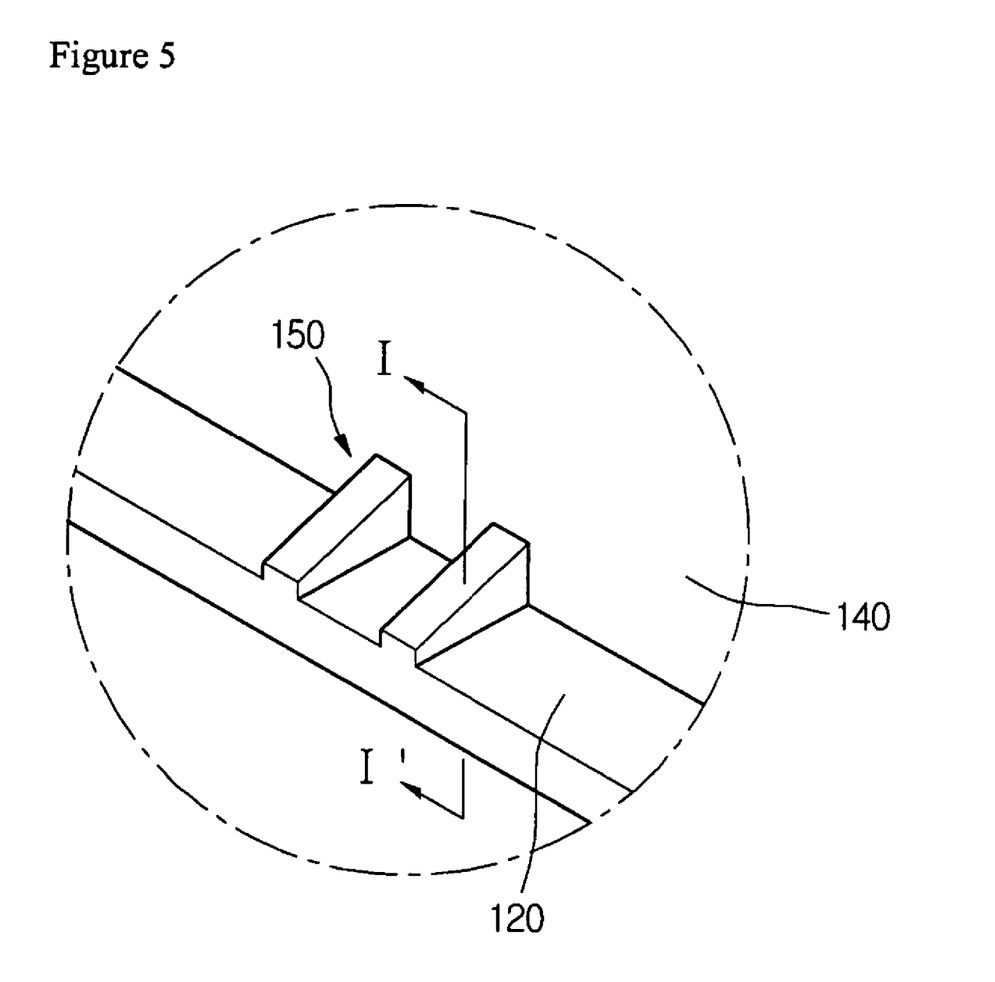
FIG. 5 is an enlarged view of a portion A illustrated in FIG. 4.
Figure 6:
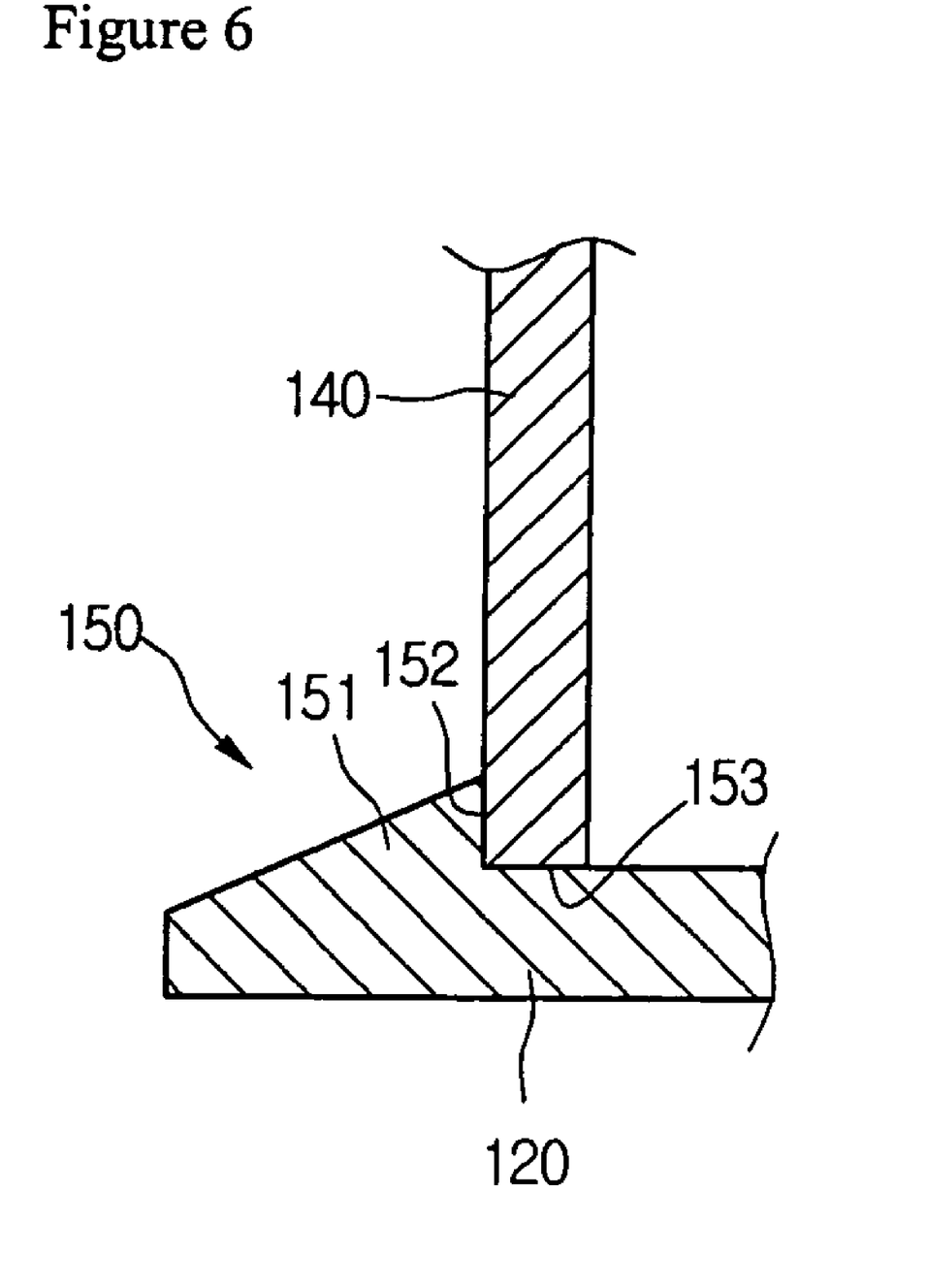
FIG. 6 is a cross-sectional view taken along a line I-I' of FIG. 5.

FIG. 5 is an enlarged view of a portion A illustrated in FIG. 4, and FIG. 6 is a cross-sectional view taken along a line I-I' of FIG. 5.

Referring to FIGS. 5 and 6, the board support panel 120 includes a hook 150. The hook 150 is a hooking protrusion for preventing detachment of the main PCB 140. The hook 150 protrudes to a predetermined height from the board support panel 120 and has an inclined surface 151 in a direction along which the main PCB 140 is inserted. That is, the inclined surface 151 rises with a predetermined inclination toward an inside of the backside seat groove 124 from a portion where the main PCB 140 is inserted. The inclined surface 151 contacts the main PCB 140 when the main PCB 140 couples to the backside seat groove 124, and is moved by external force.

For convenience of the hook 150, the hook 150 can be integrally formed with the board support panel 120.

A peak 152 having a height difference of a predetermined height with respect to the board support panel 120 is formed at a terminal of the inclined surface 151. A seat 153 on which the main PCB 140 is seated is formed at a lower portion of the peak 152.

Here, for stable coupling of the main PCB 140, a plurality of hooks 150 can be formed.

A process for coupling the main PCB 140 to the board support panel 120 will be described below.

First, the main PCB 140 approaches the backside seat groove 124, and an outer periphery of the main PCB 140 contacts the inclined surface 151 of the hook 151.

With this state, when external force is applied to the main PCB 140, the main PCB 140 is forcibly-fitted and the outer periphery of the main PCB 140 is seated on the seat 153 while the main PCB 140 moves along the inclined surface 151.

Through the above-described process, the main PCB 140 is seated on the backside seat groove 124. Since the hook 150 prevents the main PCB 140 from being detached, the main PCB 140 can be reliably coupled to the board support panel 120.

Figure 7:
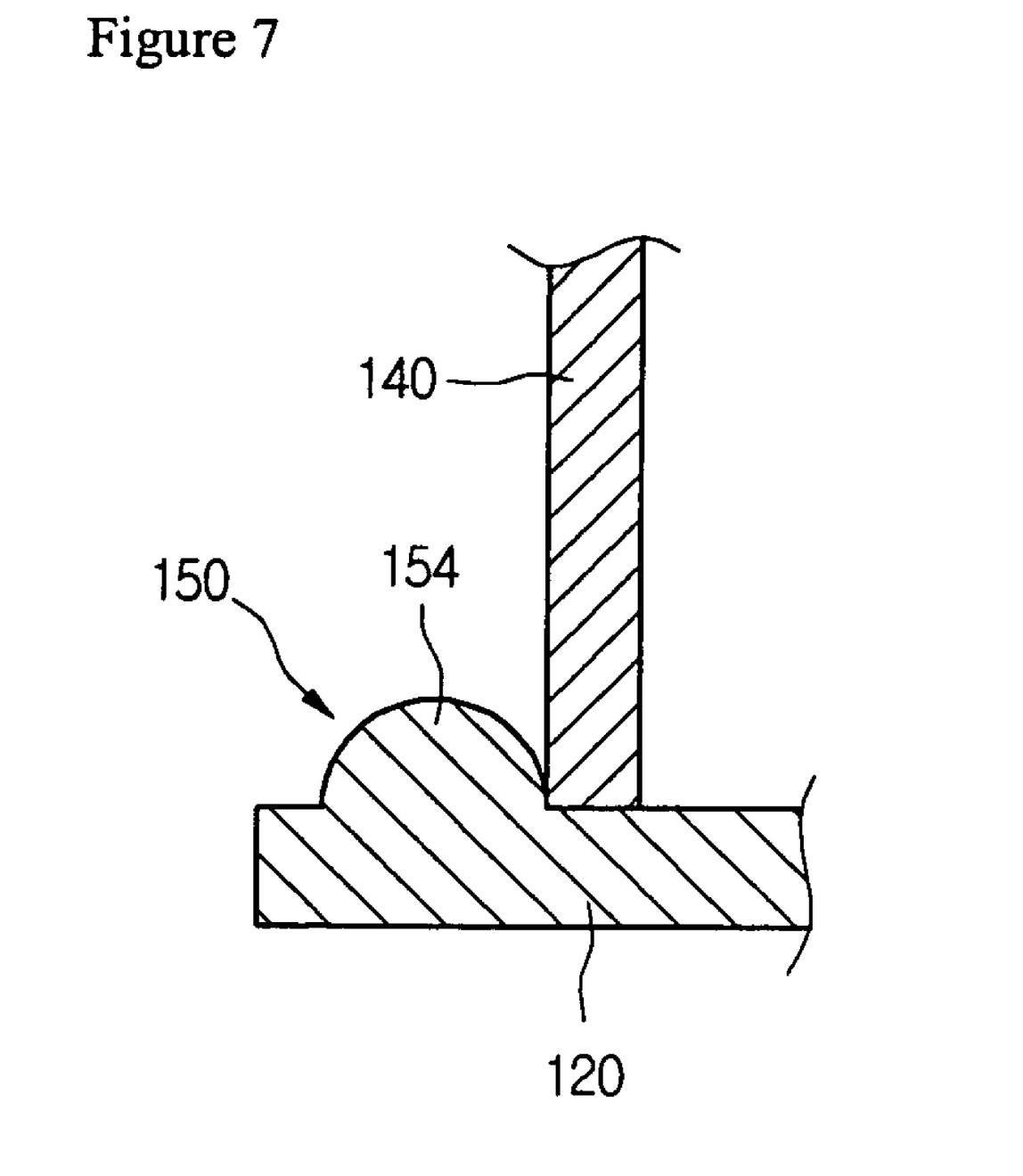
FIG. 7 is cross-sectional view of a protruding hemisphere adopted to a control unit of an oven according to another embodiment of the present invention.

FIG. 7 is cross-sectional view of a protruding hemisphere adopted to a control unit of an oven according to another embodiment of the present invention.

Referring to FIG. 7, the protruding hemisphere 154 protrudes with a predetermined curvature from the board support panel 120. The protruding hemisphere 154 is a hooking protrusion for preventing the main PCB 140 from being detached.

When the main PCB 140 slides over the protruding hemisphere 154 and is forcibly fitted in the board support panel 120, the main PCB 140 is supported and prevented from being detached.

Figure 8:
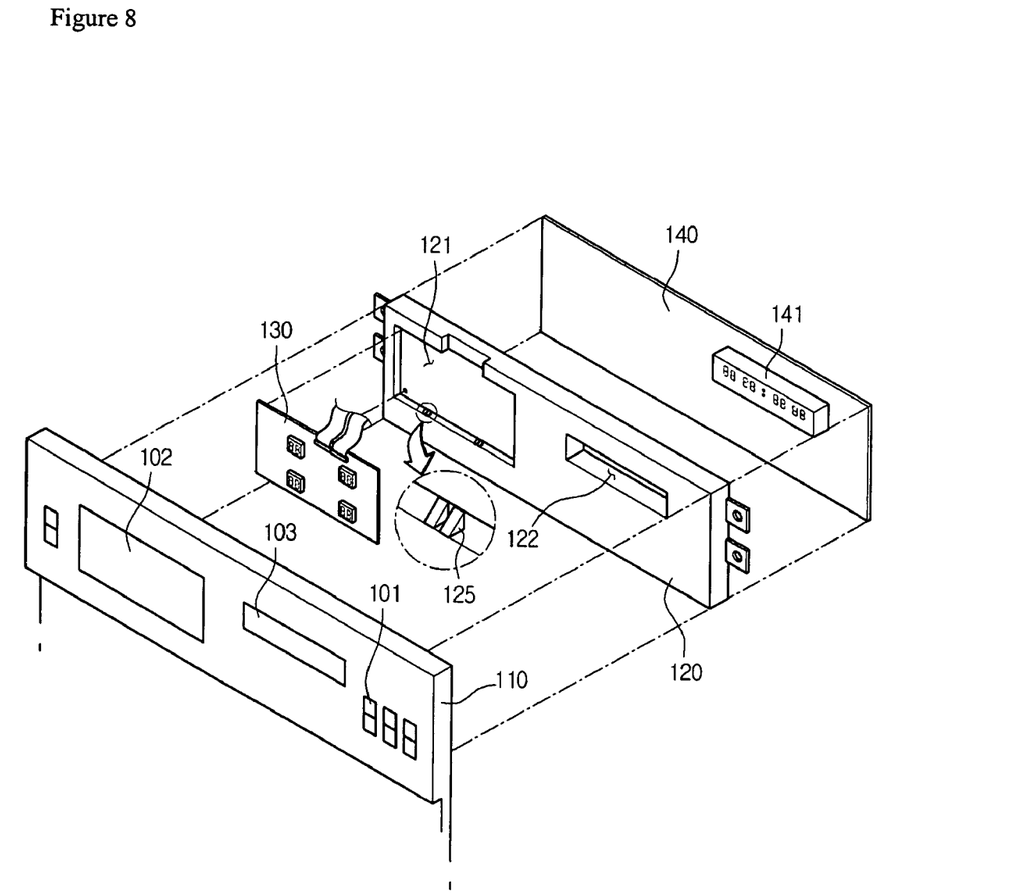
FIG. 8 is an exploded perspective view illustrating a control unit of an oven according to a further another embodiment of the present invention.

FIG. 8 is an exploded perspective view illustrating a control unit of an oven according to a further another embodiment of the present invention.

Referring to FIG. 8, the control unit 100 includes a front panel 110, a display PCB 130, a board support panel 120, and a main PCB 140 that are disposed on a backside of the front panel 110. Also, the board support panel 120 has a front seat groove 121 in which the display PCB 130 is installed.

According to the present invention, the front seat groove 121 has a hook 125. The hook 125 allows the display PCB 130 to be forcibly fitted in the front seat groove 121, thereby preventing the display PCB 130 from being detached.

According to a control unit of an oven, having the above described construction, a portion of a PCB that requires a heatsink operation is disposed on a backside of a board support panel, and a front panel is disposed on a front side of the board support panel. Therefore, heat of the PCB can be radiated through a double structure of the board support panel and the front panel. Therefore, heatsink for the PCB can be reliably performed.

Also, according to the control unit, a main PCB and a display PCB are separated from each other, and installed on one board support panel. Therefore, since various PCB can be installed on the board support panel, a control unit having various functions can be manufactured in a compact form.

Also, according to the control unit, a display PCB having relatively excellent heat-resistant characteristic is disposed on a front side of a board support panel, so that a space corresponding to the space where the display PCB has been installed is secured as an extra space on a backside of the board support panel. Therefore, a main PCB can be extended in the secured space on the backside of the board support panel. Accordingly, circuits having various control functions can be additionally installed on the main PCB, which increases extensibility of the control unit and increases space utility.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A control unit of an oven, the control unit comprising:
   a board support panel;
   a first PCB (printed circuit board) installed on a backside of the board support panel such that heat from a heat source of the oven is blocked by the board support panel so as to reduce the heat on the first PCB; and
   a second PCB installed on a front side of the board support panel.

2. The control unit according to claim 1, wherein the first PCB is a main PCB, and the second PCB is a display PCB.

3. The control unit according to claim 1, wherein the second PCB is coupled to the board support panel using a separate coupling member.

4. The control unit according to claim 1, wherein the first PCB and/or the second PCB are coupled to the board support panel using a hook.

5. The control unit according to claim 4, wherein the hook is formed on the board support panel.

6. The control unit according to claim 1, further comprising a front panel disposed on a front side of the board support panel.

7. The control unit according to claim 1, wherein the board support panel includes a seat groove in which the first PCB and/or the second PCB are seated.

8. A control unit of an oven, the control unit comprising:
a front panel;
a board support panel installed on a backside of the front panel; and
a main PCB installed on a backside of the board support panel such that heat from a heat source of the oven is blocked by the board support panel so as to reduce the heat on the main PCB.

9. The control unit according to claim 8, further comprising a display PCB on a front side of the board support panel.

10. The control unit according to claim 8, wherein the board support panel has a seat groove in which the PCB is seated.

11. The control unit according to claim 8, wherein the PCB is coupled to the board support panel using a hook.

12. The control unit according to claim 11, wherein the hook is formed on the board support panel.

13. A control unit of an oven, the control unit comprising:
a front panel;
a board support panel installed on a backside of the front panel;
a main PCB installed on a backside of the board support panel such that heat from a heat source of the oven is blocked by the board support panel so as to reduce the heat on the main PCB; and
a display PCB installed on a front side of the board support panel.

14. The control unit according to claim 13, wherein the main PCB and the display PCB are each coupled to the board support panel using a hook.

15. The control unit according to claim 14, wherein the hook is formed on the board support panel.

16. The control unit according to claim 13, wherein a seat groove in which the main PCB is seated is formed in a backside of the board support panel.

17. The control unit according to claim 13, wherein a seat groove in which the display PCB is seated is formed in a front side of the board support panel.

* * * * *